United States Patent [19]

Lee et al.

[11] Patent Number: 5,233,636
[45] Date of Patent: Aug. 3, 1993

[54] ANALOG AND DIGITAL PHASE DETECTOR FOR BIT SYNCHRONISM

[75] Inventors: Bhum C. Lee, Dongku Daejeon; Kwon C. Park, Seogu Daejeon, both of Rep. of Korea

[73] Assignees: Electronics and Telecommunications Research Institute; Korea Telecommunication Authority, Rep. of Korea

[21] Appl. No.: 694,803

[22] Filed: May 2, 1991

[30] Foreign Application Priority Data

May 11, 1990 [KR] Rep. of Korea ............... 1990-6752

[51] Int. Cl.$^5$ ............................................. H03D 3/24
[52] U.S. Cl. ..................................... 375/120; 375/82
[58] Field of Search ................... 375/80, 81, 82, 106, 375/110, 120; 329/304, 306, 310

[56] References Cited

U.S. PATENT DOCUMENTS

| 4,222,009 | 9/1980 | Moulton et al. | 375/120 |
| 4,371,974 | 2/1983 | Dupan | 375/120 |
| 4,371,975 | 2/1983 | Dupan | 375/120 |
| 4,380,815 | 4/1983 | Clendening | 375/120 |
| 4,400,664 | 4/1983 | Belkin | 375/120 |
| 4,535,459 | 8/1985 | Hoppe, Jr. | 375/80 |

Primary Examiner—Curtis Kuntz
Assistant Examiner—T. Ghebretinsae
Attorney, Agent, or Firm—Blakely, Sokoloff, Taylor & Zafman

[57] ABSTRACT

The present invention provides a phase detector comprising a driver U1 and D-type flip-flops U2 and U3 which reduces the high frequency component of the jitter in VCO, in analog-fashion operation, enables the use of general purpose logic elements being irrespective of the data bit speed, and enables the application of both analog PLL and digital PLL.

2 Claims, 2 Drawing Sheets

ANALOG AND DIGITAL PHASE DETECTOR FOR BIT SYNCHRONISM

BACKGROUND OF THE INVENTION

The present invention relates to a digital phase detector for occurring the transition of the extracted clock pulses at the center of the unit bit interval of the NRZ (nonreturn to zero) data.

In conventional circuits for bit synchronism, it is difficult to automatically adjust the transition of the clock pulses extracted from data to be at the center of the unit bit interval of the data. Therefore, they comprise an open loop-type control circuit which consists of an accurate phase complementary circuit, in order for the phases to be accurately complemented in retiming the data. However, it is necessary that such circuit has superior accuracy and good temperature characteristics of the constituting elements, because the retiming performance of the circuit depends upon the accuracy and the temperature characteristics of the constituting elements. Also, recently developed self-adjusting retiming circuits have a drawback of limiting the data bit-transmitting rate, because they frequently generate jitter and produce a phase information in the form of a pulse width.

SUMMARY OF THE INVENTION

Therefore, an object of the present invention is to overcome the problems encountered in the above-mentioned prior arts and to provide a phase detector which reduces the high frequency component of the jitter in VCO(voltage-controlled oscillator), in analog-fashion operation, enables the use of general purpose logic elements irrespective of the data bit speed, so as to be used in transmitting data at both high speed and low speed, and enables the application to both analog PLL (phase-locked loop) and digital PLL.

In accordance with the present invention, this object can be accomplished by providing an analog digital phase detector for bit synchronism comprising: means for occurring noninverted phase clock pulses and inverted phase clock pulses from clock pulses of a VCO or phase-controlled circuit; retiming means adapted to retime the received NRZ data with the noninverted phase clock pulses and the inverted phase clock pulses from the noninverted phase and inverted phase clock pulses occurring means; phase discrepancy extracting means for extracting the phase discrepancy between the NRZ data retimed with the noninverted phase clock pulses from said noninverted phase and inverted phase clock pulses occurring means and the received NRZ data and occurring said phase discrepancy in noninverted phase and inverted phase fashion; reference phase extracting means for extracting the phase discrepancy between the NRZ data retimed with the noninverted phase clock pulses from the noninverted phase and inverted phase clock pulses occurring means and the data retimed with the inverted phase clock pulses and occurring reference phase in noninverted phase and inverted phase fashion; leading phase pulse occurring means connected to the output of said phase discrepancy extracting means and the output of said reference phase extracting means and adapted to occur a digital output which is indicative of the phase discrepancy produced when the phase of the center of the data bit interval is retarded relative to the phase of the transition of the clock pulses; and trailing phase pulse occurring means connected to the output of said phase discrepancy extracting means and the output of said reference phase extracting means and adapted to occur a digital output which is indicative of the phase discrepancy produced when the phase of the center of the data bit interval is advanced relative to the phase of the transition of the clock pulses, so that the phase detection can be carried out not only in analog fashion by the comparison between the output from the phase discrepancy extracting means and the output from the reference phase extracting means, but also in digital fashion by means of said leading phase pulse occurring means and said trailing phase pulse occurring means.

BRIEF DESCRIPTION OF THE DRAWINGS

In order for the invention to be more fully understood, reference will now be made by way of example to the accompanying drawing, in which.

DETAILED DESCRIPTION OF THE PREFERRED EMBODIMENT

Figure 1:
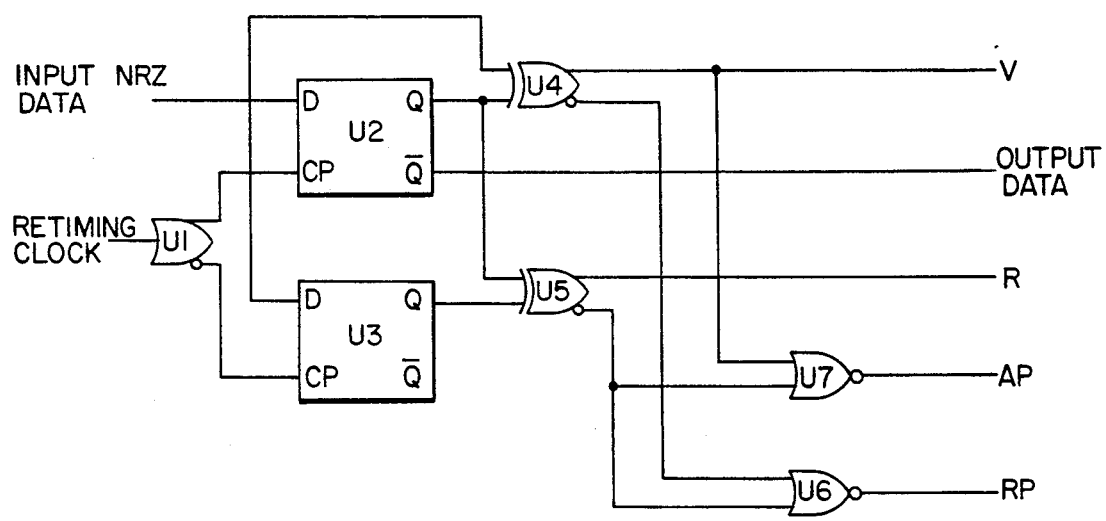
FIG. 1 is a circuit diagram in accordance with an embodiment of the present invention.

Referring to FIG. 1, there is shown an example of analog and digital phase detectors for bit synchronism utilizing an emitter-coupled logic (ECL). The detector comprises a driver U1 and D-type flip-flops U2 and U3. A NRZ data is received in both the data input D and the D-type flip-flop U2 and the data input of the D-type flip-flop U3. The NRZ data is also applied to the input of an exclusive OR- and NOR-gate U4 which is also one of constituting elements of the detector according to the present invention. The receiver U1 receives clock pulses from a VCO(voltage-controlled oscillator) or a phase-controlled circuit to produce noninverted and inverted phase clock pulses. The noninverted phase pulses and the inverted phase clock pulses are applied to the clock pulse input CP of the D-type flip-flop U2 and the clock pulse input CP of the D-type flip-flop U3, respectively, thereby causing the received NRZ data to be retimed with said pulses.

Therefore, the retimed NRZ data from the output Q of the D-type flip-flop U2 is retarded or advanced in phase, by one-half clock pulse period of a clock pulse from the VCO or the phase-controlled circuit, relative to the retimed NRZ data from the output Q of the D-type flip-flop U3. An exclusive OR- and NOR-gate U5 takes both the data from the output Q of the D-type flip-flop U2 and the data from the output Q of the D-type flip-flop U3 in exclusive OR- and NOR-fashion, so that it can produce a pulse having one-half clock pulse period of the retiming clock pulses each time when the received NRZ data is in transition.

The exclusive OR-and NOR-gate U4 also takes both the data from the output Q of the D-type flip-flop U2 and the received NRZ data in exclusive OR- and NOR-fashion. The pulse width of the output from the gate U5 depends upon the phase discrepancy between the phase of the transition of the retiming clock pulse and the phase of the center of the bit interval of the received NRZ data. Accordingly, if the transition of the clock pulses retiming the received NRZ data occurs before the center of the bit interval of the received NRZ data, the "1" level pulse width of the exclusive OR-output from the exclusive OR- and NOR-gate U4 is more than one-half clock pulse period of the retiming clock pulses. On the other hand, if the transition of the clock pulses retiming the received NRZ data occurs after the center of the bit interval of the received NRZ data, the "1" level pulse width of the exclusive OR-output from the exclusive OR-and NOR-gate U4 is less than one-half clock pulse period of the retiming clock pulses. Thus, the phase of the retiming clock pulses can be compared with the phase of the received NRZ data.

Figure 2:
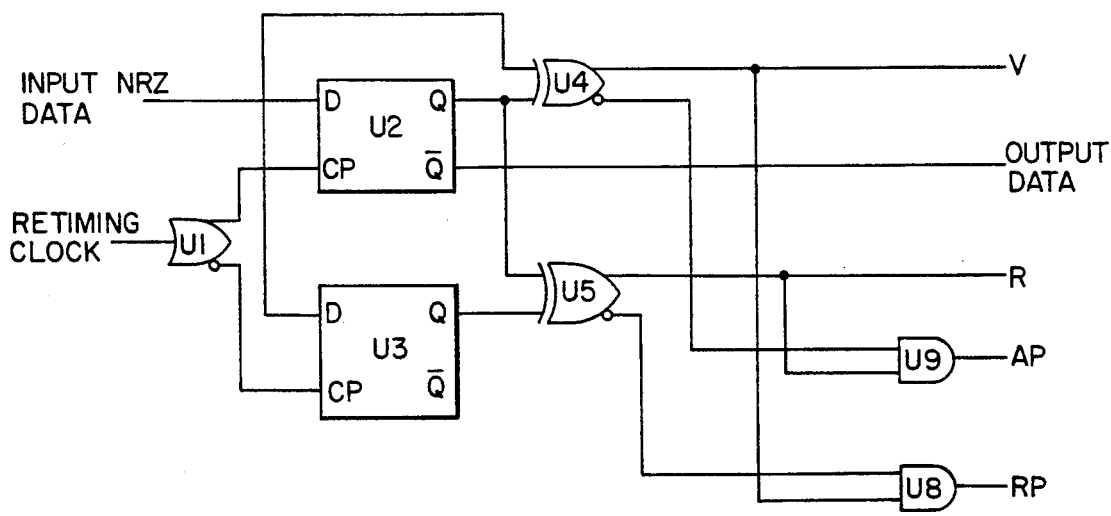
FIG. 2 is a circuit diagram in accordance with another embodiment of the present invention.
Figure 3A:
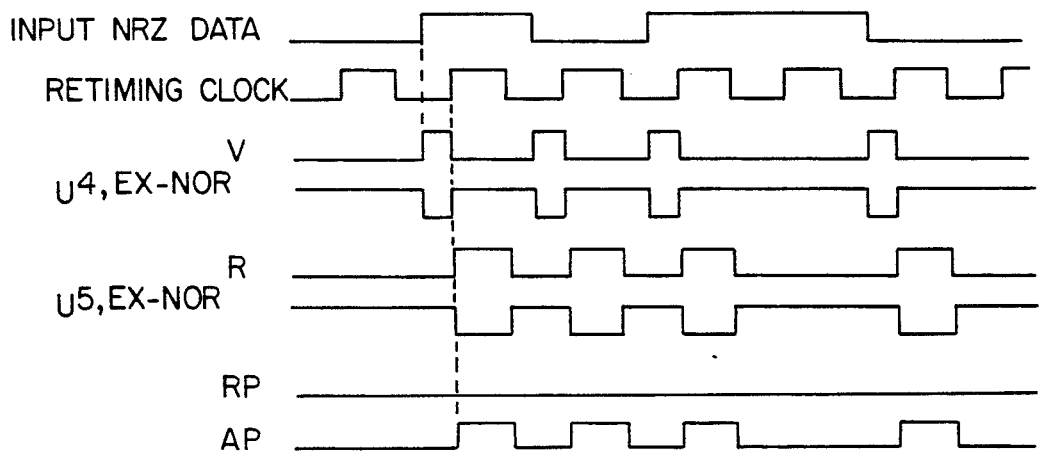
FIG. 3 is a timing diagram of the circuit in accordance with the present invention.
Figure 3B:
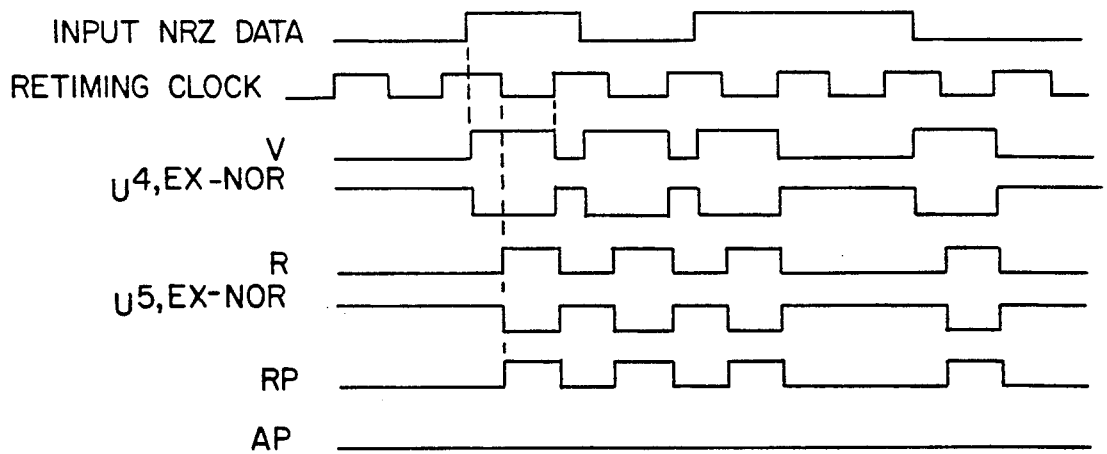

A NOR-gate U6 takes the exclusive NOR output from the exclusive OR- and NOR-gate U5 and the exclusive NOR-output from the exclusive OR- and NOR-gate U4 in NOR fashion. When the transition of the clock pulses retiming the received NRZ data occurs after the center of the bit interval of the received NRZ data, pulses occur from the output of the NOR-gate U6. A NOR-gate U7 takes the exclusive NOR output from the exclusive OR- and NOR-gate U5 and the exclusive NOR-output from the exclusive OR- and NOR-gate U4 in NOR fashion. When the transition of the clock pulses retiming the received NRZ data occurs before the center of the bit interval of the received NRZ data, pulses indicative of digital phase information occur from the output of the NOR-gate U6. The NOR-gates U6 and U7 may be replaced with AND-gates, respectively. This replacement can be accomplished by changing the input-connecting arrangement, as opposed to that for the NOR-gates U6 and U7. The AND-gates are indicated by U8 and U9 in FIG. 2. Now, an analog and digital phase comparator for synchronizing bits in phase with the clock pulse from the VCO or the phase-controlled circuit will be described, with reference to the timing diagrams of the above-mentioned analog and digital phase detector as shown in FIG. 3.

First, the upper diagram (1) shows the case where the transited position of the clock pulse from the VCO or the phase-controlled circuit is advanced relative to the center of the unit bit interval of the NRZ data, that is, where the edge of the retiming noninverted phase clock pulse occurs before the center of the unit bit interval of the NRZ data. At this time, the time interval between the NRZ data retimed with the retiming noninverted phase clock pulses and the "1" level output, taken in exclusive OR- and NOR-fashion, of the exclusive OR- and NOR-gate U4 is less than one-half clock pulse period of the retiming clock pulses. The time interval does not coincide with the "1" level reference pulses from the exclusive OR-output of the exclusive OR-and NOR-gate U5. By utilizing this, phase information can be taken in both analog and digital fashion.

Secondly, the lower diagram (2) shows the case where the transited position of the clock pulse from the VCO or the phase-controlled circuit is retarded relative to the center of the unit bit interval of the NRZ data, that is, where the edge of the retiming noninverted phase clock pulse occurs after the center of the unit bit interval of the NRZ data. At this time, the time interval between the NRZ data retimed with the retiming noninverted phase clock pulses and the "1" level output, taking in exclusive OR- and NOR-fashion, of the exclusive OR- and NOR-gate U4 is more than one-half clock pulse period of the retiming clock pulses. The time interval does coincide partially with the "1" level reference pulses from the exclusive OR-output of the exclusive OR- and NOR-gate U5. By utilizing this, the phase information can be taken in both analog and digital fashion.

Secondly, the lower diagram (2) shows the case where the transited position of the clock pulse from the VCO or the phase-controlled circuit is properly at the center of the unit bit interval of the NRZ data, that is, where the edge of the retiming noninverted phase clock pulse occurs at the center of the unit bit interval of the NRZ data. At this time, the time interval between the NRZ data retimed with the retiming noninverted phase clock pulses and the "1" level output, taken in exclusive OR- and NOR-fashion, of the exclusive OR- and NOR-gate U4 is the same as one-half clock pulse period of the retiming clock pulses. The time interval is compared with the reference pulses, thereby causing the phase information to be taken in analog fashion. On the other hand, the NOR-gate U6 or the NRO-gate U7 generates pulses in digital fashion. When the edge of the retiming noninverted phase clock pulse coincides with the center of the unit bit interval of the NRZ data, a stable situation is provided in that pulses are alternatively generated from the outputs of the NOR-gate U6 and the NOR-gate U7, by means of outer PLL.

As apparent from the above description, the present invention uses simple logic elements in order to analogly and digitally control the clock pulses for bit synchronism. The digital phase detector of the present invention can be used in lieu of the conventional phase detectors and provides the following specific effects:

First, enabling the application to both the analog PLL circuit and the digital PLL circuit in virtue of the comparison in both analog and digital fashion;

Secondly, enabling the use for the bit synchronism with the high speed NRZ data in virtue of the face that the circuit producing the result of the phase comparison in digital fashion comprises most simple logic gates, causing the operation thereof to be irrespective of the frequency of the retiming clock pulses; and Thirdly, enabling the integration, in virtue of the constitution of simple and standard logic elements.

What is claimed is:

1. An analog digital phase detector for bit synchronism comprising:

means for providing noninverting phase clock pulses and inverting phase clock pulses from clock pulses of a VCO(Voltage-Controlled Oscillator) or phase-controlled circuit;

retiming means adapted to retime the received NRZ data with the noninverting phase clock pulses and the inverting phase clock pulses from the noninverting phase and inverting phase clock pulses providing means;

phase discrepancy extracting means for extracting the phase discrepancy between the NRZ data retimed with the noninverting phase clock pulses from said noninverting phase and inverting phase clock pulses providing means and the received NRZ data and providing said phase discrepancy in noninverting phase and inverting phase fashion;

reference phase extracting means for extracting the phase discrepancy between the NRZ data retimed with the noninverting phase clock pulses from the noninverting phase and inverting phase clock pulses providing means and the data retimed with the inverting phase clock pulses and providing reference phase in noninverting phase and inverting phase fashion;

leading phase pulse providing means connected to the output of said phase discrepancy extracting means and the output of said reference phase extracting means and adapted to provide a digital output which is indicative of the phase discrepancy produced when the phase of the center of the data bit interval is retarded relative to the phase of the transition of the clock pulses; and trailing phase pulse providing means connected to the output of said phase discrepancy extracting means and the output of said reference phase extracting means and adapted to provide a digital output which is indicative of the phase discrepancy produced when the phase of the center of the data bit interval is advanced relative to the phase of the transition of the clock pulses, so that the phase detection can be carried out not only in analog fashion by the comparison between the output from the phase discrepancy extracting means and the output from the reference phase extracting means, but also in digital fashion by means of said leading phase pulse providing means and said trailing phase pulse proving means, wherein said retiming means comprises a first D-type flip-flop having a clock pulse input receiving the noninverted phase clock pulses from said noninverted phase and inverted phase clock pulses providing means and a data input receiving the NRZ data and a second D-type flip-flop having a clock pulse input receiving the inverted phase clock pulses from said noninverted phase and inverted phase clock pulses providing means and a data input receiving the NRZ data, wherein said phase discrepancy extracting means comprises an exclusive OR- and NOR-gate receiving the output from said first D-type flip-flop and the NRZ data, wherein aid reference phase extracting means comprises an exclusive OR- and NOR-gate receiving the output from said first D-type flip-flop and the output of said second D-type flip-flop, wherein said leading phase pulse providing means comprises a NOR-gate receiving the exclusive OR-output from said exclusive OR- and NOR-gate of the phase discrepancy extracting means and the exclusive NOR-output from said exclusive OR- and NOR-gate of the reference phase extracting means, and wherein said trailing phase pulse providing means comprises a NOR-gate receiving the exclusive NOR-output from said exclusive OR- and NOR-gate of the phase discrepancy extracting means and the exclusive NOR-output from said exclusive OR- and NOR-gate of the reference phase extracting means.

2. An analog digital phase detector for bit synchronism comprising:

means for providing noninverting phase clock pulses and inverting phase clock pulses from clock pulses of a VCO(Voltage-Controlled Oscillator) or phase-controlled circuit;

retiming means adapted to retime the received NRZ data with the noninverting phase clock pulses and the inverting phase clock pulses from the noninverting phase and inverting phase clock pulses providing means;

phase discrepancy extracting means for extracting the phase discrepancy between the NRZ data retimed with the noninverting phase clock pulses from said non inverting phase and inverting phase clock pulses providing means and the received NRZ data and providing said phase discrepancy in noninverting phase and inverting phase fashion;

reference phase extracting means for extracting the phase discrepancy between the NRZ data retimed with the noninverting phase clock pulses from the noninverting phase and inverting phase clock pulses providing means and the data retimed with the inverting phase clock pulses and providing reference phase in noninverting phase and inverting phase fashion;

leading phase pulse providing means connected to the output of said phase discrepancy extracting means and the output of said reference phase extracting means and adapted to provide a digital output which is indicative of the phase discrepancy produced when the phase of the center of the data bit interval is retarded relative to the phase of the transition of the clock pulses; and trailing phase pulse providing means connected to the output of said phase discrepancy extracting means and the output of said reference phase extracting means and adapted to provide a digital output which is indicative of the phase discrepancy produced when the phase of the center of the data bit interval is advanced relative to the phase of the transition of the clock pulses, so that the phase detection can be carried out not only in analog fashion by the comparison between the output from the phase discrepancy extracting means and the output from the reference phase extracting means, but also in digital fashion by means of said leading phase pulse providing means and said trailing phase pulse proving means, wherein said retiming means comprises a first D-type flip-flop having a clock pulse input receiving the noninverted phase clock pulses from said noninverted phase and inverted phase clock pulses providing means and a data input receiving the data and a second D-type flip-flop having a clock pulse input receiving the inverted phase clock pulse from said noninverted phase and inverted phase clock pulses providing means and a data input receiving the NRZ data, wherein said phase discrepancy extracting means comprises an exclusive OR- and NOR-gate receiving the output from said first D-type flip-flop and the NRZ data, wherein said reference phase extracting means comprises an exclusive OR- and NOR-gate receiving the output from said first D-type flip-flop and the output of said second D-type flip-flop, wherein said leading phase pulse providing means comprises an AND-gate receiving the exclusive NOR-output from said exclusive OR- and NOR-gate of the phase discrepancy extracting means and the exclusive OR-output from said exclusive OR- and NOR-gate of the reference phase extracting means, and wherein said trailing phase pulse providing means comprises an AND-gate receiving the exclusive NOR-output from said exclusive OR- and NOR-gate of the phase discrepancy extracting means and the exclusive NOR-output from said exclusive OR-and NOR-gate of the reference phase extracting means.

* * * * *